(12) United States Patent
Liao et al.

(10) Patent No.: US 10,319,690 B2
(45) Date of Patent: Jun. 11, 2019

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Wen-Shiang Liao, Miaoli County (TW); Chewn-Pu Jou, Hsinchu (TW); Chih-Hang Tung, Hsinchu County (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 53 days.

(21) Appl. No.: 15/581,649

(22) Filed: Apr. 28, 2017

(65) Prior Publication Data

US 2018/0315720 A1    Nov. 1, 2018

(51) Int. Cl.
| | |
|---|---|
| *H01P 3/16* | (2006.01) |
| *H01L 21/48* | (2006.01) |
| *H01L 21/56* | (2006.01) |
| *H01L 23/31* | (2006.01) |
| *H01L 23/66* | (2006.01) |
| *H01L 25/00* | (2006.01) |
| *H01L 25/18* | (2006.01) |
| *H01L 23/498* | (2006.01) |

(Continued)

(52) U.S. Cl.
CPC ............ *H01L 23/66* (2013.01); *H01L 21/486* (2013.01); *H01L 21/4853* (2013.01); *H01L 21/563* (2013.01); *H01L 21/565* (2013.01); *H01L 23/3142* (2013.01); *H01L 23/49816* (2013.01); *H01L 23/5384* (2013.01); *H01L 23/5386* (2013.01); *H01L 25/0655* (2013.01); *H01L 25/18* (2013.01); *H01L 25/50* (2013.01); *H01L 23/3128* (2013.01); *H01L 2223/6627* (2013.01); *H01L 2224/16225* (2013.01); *H01L 2224/32225* (2013.01); *H01L 2224/73204* (2013.01); *H01L 2224/92125* (2013.01); *H01L 2924/15311* (2013.01); *H01L 2924/18161* (2013.01); *H01P 3/16* (2013.01)

(58) Field of Classification Search
CPC ........................... H01L 23/66; G02B 6/12004
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

*Primary Examiner* — Changhyun Yi
(74) *Attorney, Agent, or Firm* — WPAT, P.C., Intellectual Property Attorneys; Anthony King

(57) ABSTRACT

A semiconductor structure includes a substrate; an interconnect structure formed over the substrate and including a dielectric layer over the substrate, a first conductive member formed within the dielectric layer and a second conductive member formed within the dielectric layer; a waveguide formed between the first conductive member and the second conductive member; a first die disposed over the interconnect structure and electrically connected to the first conductive member; and a second die disposed over the interconnect structure and electrically connected to the second conductive member, wherein the waveguide is coupled with the first conductive member and the second conductive member.

20 Claims, 14 Drawing Sheets

(51) Int. Cl.
*H01L 23/538* (2006.01)
*H01L 25/065* (2006.01)

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2008/0118200 A1* | 5/2008 | Kim | G02B 6/43 385/14 |
| 2008/0285910 A1* | 11/2008 | Yamada | G02B 6/12002 385/14 |
| 2014/0285277 A1* | 9/2014 | Herbsommer | H01P 3/16 333/1 |
| 2015/0036970 A1* | 2/2015 | Lai | G02B 6/13 385/14 |
| 2015/0226918 A1* | 8/2015 | Bauters | H01L 31/105 385/14 |
| 2015/0362674 A1* | 12/2015 | Chen | G02B 6/122 385/14 |
| 2016/0327737 A1* | 11/2016 | Zhang | H01L 21/8258 |
| 2017/0179078 A1* | 6/2017 | Jung | H01L 25/50 |

\* cited by examiner

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS) is widely used to integrate several chips into a single semiconductor device by through substrate via (TSV). During the CoWoS operation, a number of chips are assembled on a single semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
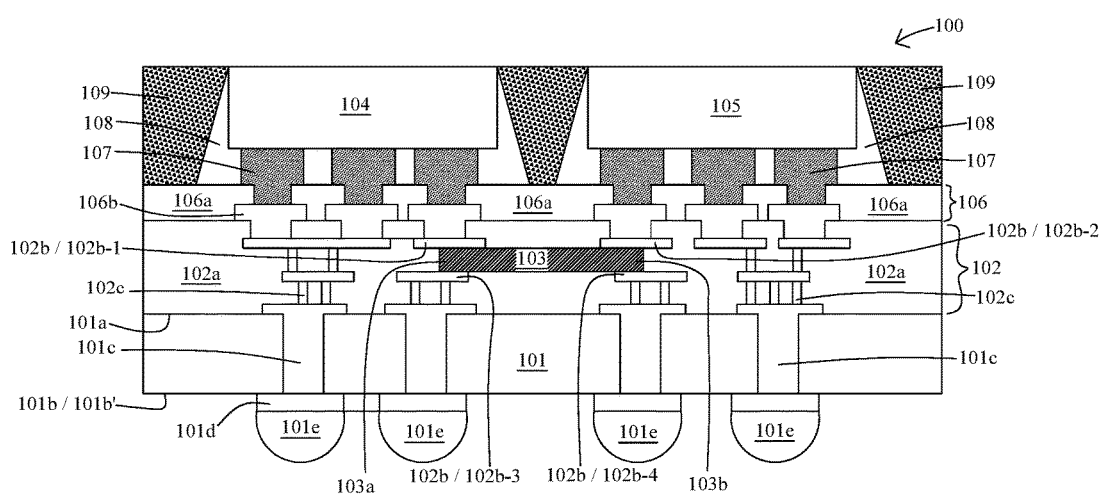
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

An electronic device including various semiconductor chips is manufactured by a number of operations. During the manufacturing process, the semiconductor chips with different functionalities and dimensions are integrated into a single module. Circuitries of the semiconductor chips are integrated and connected through conductive traces. The semiconductor chips communicate with each other by transmitting an electrical signal from one device to another device through the conductive traces. However, such transmission between the semiconductor chips may not satisfy a high demand of communication between the semiconductor chips. As a result, performance of the electronic device may not be at a desired level.

In the present disclosure, a semiconductor structure is disclosed. The semiconductor structure includes a substrate, an interconnect structure disposed or deposited over the substrate and including a dielectric layer over the substrate, a first conductive member disposed within the dielectric layer and a second conductive member disposed or formed within the dielectric layer, a waveguide disposed or fabricated within the dielectric layer, a first die disposed over the interconnect structure and electrically connected to the first conductive member, a second die disposed over the interconnect structure and electrically connected to the second conductive member, wherein the waveguide is coupled with the first conductive member and the second conductive member.

An electrical signal is transmitted from the first die to the first conductive member, and the electrical signal is converted to an electromagnetic signal. The electromagnetic signal is transmitted from the first conductive member to the second conductive member within the waveguide. When the electromagnetic signal is received by the second conductive member, the electromagnetic signal is converted to an electrical signal. The electrical signal is then transmitted from the second conductive member to the second die. The electromagnetic signal is in non-visible (e.g. radio wave, microwave, etc.) spectrum and transmitted in a high frequency (e.g. substantially greater than 10 GHz) along the waveguide, an energy loss of transmission of the electromagnetic signal by the waveguide can be minimized.

FIG. 1 is a schematic cross sectional view of a semiconductor structure 100 in accordance with various embodiments of the present disclosure. In some embodiments, the semiconductor structure 100 includes a substrate 101, an interconnect structure 102, a waveguide 103, a first die 104 and a second die 105.

In some embodiments, the semiconductor structure 100 is a semiconductor package. In some embodiments, the semiconductor structure 100 is an integrated fan out (InFO) package, where I/O terminals of the first die 104 or the second die 105 are fanned out and redistributed over a surface of the first die 104 or the second die 105 in a greater area. In some embodiments, the semiconductor structure 100 is a chip on wafer on substrate (CoWoS) packaging structure. In some embodiments, the semiconductor structure 100 is a three dimensional integrated circuit (3D IC). In some embodiments, the semiconductor structure 100 is configured to perform an ultra-high speed signal transmission (e.g. transmission speed substantially greater than 10 Gigabyte per second (Gb/s)) within the semiconductor structure 100 in a high frequency (e.g. a frequency substantially greater than about 10 Giga Hertz (GHz)).

In some embodiments, the substrate 101 is a semiconductive substrate. In some embodiments, the substrate 101 includes semiconductive material such as silicon, germanium, gallium, arsenic, or combinations thereof. In some embodiments, the substrate 101 is an interposer or the like. In some embodiments, the substrate 101 is a silicon substrate or silicon interposer. In some embodiments, the substrate 101 includes material such as ceramic, glass, polymer or the like. In some embodiments, the substrate 101 includes organic material. In some embodiments, the substrate 101 has a quadrilateral, rectangular, square, polygonal or any other suitable shape.

In some embodiments, the substrate 101 includes a first surface 101a and a second surface 101b opposite to the first surface 101a. In some embodiments, there is a via 101c in the substrate 101 extended through at least a portion of the substrate 101. In some embodiments, the via 101c is extended between the first surface 101a and the second surface 101b. In some embodiments, the via 101c includes a conductive material such as copper, silver, gold, aluminum, etc. In some embodiments, the via 101c is a through silicon via (TSV).

In some embodiments, a first pad 101d is disposed over and electrically connected to the via 101c. In some embodiments, the first pad 101d is disposed over the second surface 101b of the substrate 101. In some embodiments, the first pad 101d includes metal or metal alloy. In some embodiments, the first pad 101d includes chromium, copper, gold, titanium, silver, nickel, palladium or tungsten, etc. In some embodiments, the first pad 101d is a solderable surface and serves as a platform for receiving a solder material and for electrically connecting a circuitry of the substrate 101 with an external component or external circuitry.

In some embodiments, a first conductive bump 101e is disposed or fabricated over the substrate 101. In some embodiments, the first conductive bump 101e is fabricated over the second surface 101b of the substrate 101. In some embodiments, the first conductive bump 101e is fabricated over and electrically connected to the first pad 101d. In some embodiments, the first conductive bump 101e is electrically connected to the via 101c. In some embodiments, the first conductive bump 101e is in a cylindrical, spherical or hemispherical shape. In some embodiments, the first conductive bump 101e is a solder joint, a solder bump, a solder ball, a ball grid array (BGA) ball, a controlled collapse chip connection (C4) bump or the like. In some embodiments, the first conductive bump 101e is a conductive pillar or post. In some embodiments, the first conductive bump 101e includes metals such as lead, tin, copper, gold, nickel, etc.

In some embodiments, the interconnect structure 102 is disposed or deposited over the substrate 101. In some embodiments, the interconnect structure 102 is deposited over the first surface 101a of the substrate 101. In some embodiments, the interconnect structure 102 includes a dielectric layer 102a deposited over the substrate 101, several conductive members 102b disposed or formed within the dielectric layer 102a, and several conductive vias 102c disposed or formed within the dielectric layer 102a.

In some embodiments, the dielectric layer 102a includes one or more dielectric layers. In some embodiments, the dielectric layer 102a includes silicon dioxide, fluorine-doped silicon dioxide, carbon-doped silicon dioxide, porous silicon dioxide, a dielectric material having a low dielectric constant (Low K), a dielectric material having an ultra-low dielectric constant (ULK), a dielectric material having a dielectric constant substantially less than a dielectric constant of silicon dioxide, a dielectric material having a dielectric constant substantially less than 4.

In some embodiments, the conductive members 102b and the conductive vias 102c are configured to electrically connect to the via 101c or the first conductive bump 101e. In some embodiments, the conductive members 102b and the conductive vias 102c are electrically connected to a circuitry disposed over or within the substrate 101. In some embodiments, the conductive member 102b is electrically coupled with the conductive via 102c. In some embodiments, the conductive members 102b are laterally extended within the dielectric layer 102a, and the conductive vias 102c are vertically extended within the dielectric layer 102a. In some embodiments, the conductive members 102b and the conductive vias 102c include conductive material such as gold, silver, copper, nickel, tungsten, aluminum, tin and/or alloys thereof.

In some embodiments, the conductive members 102b includes a first conductive member 102b-1 and a second conductive member 102b-2. In some embodiments, the first conductive member 102b-1 and the second conductive member 102b-2 are formed or disposed within the dielectric layer 102a. In some embodiments, the first conductive member 102b-1 and the second conductive member 102b-2 are formed adjacent to each other. In some embodiments, a dielectric is between the first conductive member 102b-1 and the second conductive member 102b-2. In some embodiments, the first conductive member 102b-1 is horizontally aligned with the second conductive member 102b-2. In some embodiments, the first conductive member 102b-1 and the second conductive member 102b-2 are electrically connected to corresponding conductive vias 102c. In some embodiments, the via 101c is electrically connected to the first conductive member 102b-1, the second conductive member 102b-2, the third conducive member 102b-3 or the fourth conductive member 102b-4.

In some embodiments, the first conductive member 102b-1 is configured to convert an electrical signal to an electromagnetic signal. In some embodiments, the first conductive member 102b-1 is configured to transmit the electromagnetic signal to the second conductive member 102b-2. In some embodiments, the second conductive member 102b-2 is configured to receive the electromagnetic signal from the first conductive member 102b-1. In some embodiments, the second conductive member 102b-2 is configured to convert the electromagnetic signal to an electrical signal. In some embodiments, the first conductive member 102b-1 is a first transmission electrode, and the second conductive member 102b-2 is a first receiving electrode. In some embodiments, the electromagnetic signal is non-visible radiation such as microwave, radio wave, etc. In some embodiments, the electromagnetic signal is not a visible light.

In some embodiments, the conductive members 102b includes a third conductive member 102b-3 and a fourth conductive member 102b-4. In some embodiments, the third conductive member 102b-3 and the fourth conductive member 102b-4 are disposed or formed within the dielectric layer 102a. In some embodiments, the third conductive member 102b-3 and the fourth conductive member 102b-4 are formed adjacent to each other. In some embodiments, the third conductive member 102b-3 is horizontally aligned with the fourth conductive member 102b-4. In some embodiments, the third conductive member 102b-3 and the fourth conductive member 102b-4 are electrically connected to corresponding conductive vias 102c.

In some embodiments, the third conductive member 102b-3 is disposed opposite to the first conductive member 102b-1, and the fourth conductive member 102b-4 is disposed opposite to the second conductive member 102b-2. In some embodiments, the first conductive member 102b-1 and the third conductive member 102b-3 are operable in pairs, and the second conductive member 102b-2 and the fourth conductive member 102b-4 are operable in pairs.

In some embodiments, the third conductive member 102b-3 is configured to convert an electrical signal to an electromagnetic signal and transmit the electromagnetic signal to the second conductive member 102b-2 or the fourth conductive member 102b-4. In some embodiments, the fourth conductive member 102b-4 is configured to receive the electromagnetic signal from the first conductive member 102b-1 or the third conductive member 102b-3 and convert the electromagnetic signal to an electrical signal. In some embodiments, the third conductive member 102b-3 is a second transmission electrode, and, the fourth conductive member 102b-4 is a second receiving electrode. In some embodiments, the second transmission electrode is disposed opposite to the first transmission electrode, and the second receiving electrode is disposed opposite to the first receiving electrode. In some embodiments, the first conductive member 102b-1 has configuration similar to the third conductive member 102b-3, and the second conductive member 102b-2 has configuration similar to the fourth conductive member 102b-4.

In some embodiments, the waveguide 103 is disposed within the dielectric layer 102a of the interconnect structure 102. In some embodiments, the waveguide 103 is disposed between two of the conductive members 102b. In some embodiments, the waveguide 103 is disposed between the first conductive member 102b-1 and the second conductive member 102b-2 or between the third conductive member 102b-3 and the fourth conductive member 102b-4. In some embodiments, the waveguide 103 is coupled with the first conductive member 102b-1 and the second conductive member 102b-2. In some embodiments, the waveguide 103 is coupled with the third conductive member 102b-3 and the fourth conductive member 102b-4. In some embodiments, the waveguide 103 is laterally extended within the dielectric layer 102a. In some embodiments, a height of the waveguide 103 is about 1 μm. In some embodiments, a width of the waveguide 103 is about 1 μm. In some embodiments, the width of the waveguide 103 is about 10 times of the height of the waveguide 103.

In some embodiments, the waveguide 103 includes a first end 103a and a second end 103b opposite to the first end 103a. In some embodiments, the first end 103a is coupled with the first conductive member 102b-1 or the third conductive member 102b-3, and the second end 103b is coupled with the second conductive member 102b-2 or the fourth conductive member 102b-4. In some embodiments, the first end 103a is surrounded by the first conductive member 102b-1 and the third conductive member 102b-3, and the second end 103b is surrounded by the second conductive member 102b-2 and the fourth conductive member 102b-4.

In some embodiments, the waveguide 103 is dielectric and configured to transmit an electromagnetic signal from one of the conductive members 102b to another one of the conductive members 102b. In some embodiments, the electromagnetic signal is transmitted within the waveguide 103. In some embodiments, the waveguide 103 is configured to transmit an electromagnetic signal from the first conductive member 102b-1 to the second conductive member 102b-2 within the waveguide 103 or from the third conductive member 102b-3 to the fourth conductive member 102b-4. In some embodiments, the electromagnetic signal is non-visible radiation such as microwave, radio wave, etc. In some embodiments, the electromagnetic signal is not a visible light.

In some embodiments, an electrical signal from the first conductive member 102b-1 is converted to an electromagnetic signal, and the electromagnetic signal is transmitted within the waveguide 103 from the first conductive member 102b-1 to the second conductive member 102b-2, and the electromagnetic signal is converted to an electrical signal at the second conductive member 102b-2. As such the electrical signal is transmitted from the first conductive member 102b-1 to the second conductive member 102b-2 through the waveguide 103. In some embodiments, the waveguide 103 is configured to transmit the electromagnetic signal in a frequency of greater than 10 Giga Hertz (GHz). In some embodiments, a transmission speed of the electromagnetic signal is substantially greater than 10 Gigabytes per second (Gb/s).

In some embodiments, a dielectric constant of the waveguide 103 is substantially greater than the dielectric constant of the dielectric layer 102a. Since the dielectric constant of the waveguide 103 is substantially greater than the dielectric constant of the dielectric layer 102a, the waveguide 103 causes the electromagnetic signal entered into the waveguide 103 to be reflected within the waveguide 103 by total internal reflection, such that the electromagnetic signal can be transmitted from the first end 103a to the second end of the waveguide 103 or from the first conductive member 102b-1 to the second conductive member 102b-2.

In some embodiments, the dielectric constant of the waveguide 103 is substantially greater than a dielectric constant of silicon dioxide. In some embodiments, the dielectric constant of the waveguide 103 is substantially greater than 4. In some embodiments, the dielectric constant of the waveguide 103 is substantially greater than 7. In some embodiments, the dielectric constant of the waveguide 103 is substantially greater than 13. In some embodiments, the dielectric constant of the waveguide 103 is substantially greater than 100. In some embodiments, the dielectric constant of the waveguide 103 is substantially greater than 200. In some embodiments, the dielectric constant of the waveguide 103 is substantially greater than 500.

In some embodiments, the waveguide 103 includes silicon nitride or silicon carbide. In some other embodiments, the waveguide 103 includes low-temperature (e.g., 180° C.) silicon dioxide (CVD-SiO2), silicon nitride (SiNx) or silicon oxynitride (SiOxNy) deposited by any suitable depositions such as chemical vapor deposition (CVD), plasma enhanced CVD (PECVD), sub-atmospheric CVD (SACVD), atmospheric pressure CVD (APCVD), metal organic CVD (MOCVD), laser CVD (LCVD), etc. In some embodiments, the waveguide 103 includes low-temperature (e.g., <240° C.) titanium dioxide (TiO2) deposited by LCVD, electron beam (e.g. electronic gun) evaporation or etc. In some embodiments, the waveguide 103 includes low-temperature (e.g., 210° C.) high-k dielectric material such as zirconium dioxide (ZrO2), aluminum oxide (Al2O3), hafnium oxide (HfOx), Hafnium silicate (HfSiOx), zirconium titanate (ZrTiOx), tantalum oxide (TaOx), etc. In some embodiments, the waveguide 103 includes strontium titanate (SrTiO3 having dielectric constant (k) of about 83 to about 100) or barium titanate (BaTiO3 having dielectric constant (k) of about 500).

In some embodiments, the first die 104 is disposed over the interconnect structure 102. In some embodiments, the first die 104 is disposed over the first conductive member 102b-1 or the third conductive member 102b-3. In some embodiments, the first die 104 is fabricated with a predetermined functional circuit within the first die 104. In some embodiments, the first die 104 is singulated from a semiconductive wafer by a mechanical or laser blade. In some embodiments, the first die 104 comprises a variety of electrical circuits suitable for a particular application. In some embodiments, the electrical circuits include various devices such as transistors, capacitors, resistors, diodes and/or the like. In some embodiments, the first die 104 is a logic device die, central processing unit (CPU) die, graphics processing unit (GPU) die, mobile phone application processing (AP) die or the like. In some embodiments, the first die 104 is a system on chip (SoC) that integrates all electronic components into a single die. In some embodiments, the first die 104 is a die, a chip or a package. In some embodiments, the first die 104 has a top cross section (a cross section from the top view of the semiconductor structure 100 as shown in FIG. 1) in a quadrilateral, a rectangular or a square shape.

In some embodiments, the first die 104 is a transmission die or a driver die. In some embodiments, the first die 104 includes a transmission circuit or a transmitter. In some embodiments, the transmission circuit of the first die 104 is configured to generate an electrical signal. In some embodiments, the first die 104 is electrically connected to the first conductive member 102b-1 or the third conductive member 102b-3. In some embodiments, the electrical signal is transmitted from the first die 104 to the first conductive member 102b-1 or the third conductive member 102b-3.

In some embodiments, the first die 104 is electrically connected to the first conductive member 102b-1 or the third conductive member 102b-3 through a redistribution layer (RDL) 106 and a second conductive bump 107. In some embodiments, the RDL 106 is disposed or formed over the interconnect structure 102. In some embodiments, the RDL 106 is configured to re-route a path of circuitry from the first die 104 to the conductive members 102, so as to redistribute I/O terminals of the first die 104.

In some embodiments, the RDL 106 includes a second dielectric layer 106a and a second pad 106b. In some embodiments, the second dielectric layer 106a is disposed or deposited over the dielectric layer 102a. In some embodiments, the second pad 106b is partially exposed from the second dielectric layer 106a. In some embodiments, the second pad 106b is electrically connected to the conductive via 102c or the conductive member 102b. In some embodiments, the second pad 106b is extended into the dielectric layer 102a. In some embodiments, a portion of the second pad 106b is surrounded by the dielectric layer 102a. In some embodiments, the second dielectric layer 106a includes dielectric material such as silicon oxide, silicon nitride, silicon carbide, silicon oxynitride or the like. In some embodiments, the second pad 106b includes conductive material such as gold, silver, copper, nickel, tungsten, aluminum, palladium and/or alloys thereof.

In some embodiments, the second conductive bump 107 is disposed or fabricated between the interconnect structure 102 and the first die 104. In some embodiments, the second conductive bump 107 is disposed between the RDL 106 and the first die 104. In some embodiments, the first die 104 is electrically connected to the conductive member 102 or the second pad 106b by the second conductive bump 107. In some embodiments, the second conductive bump 107 is in a cylindrical, spherical or hemispherical shape. In some embodiments, the second conductive bump 107 is a solder joint, a solder bump, a solder ball, a ball grid array (BGA) ball, a controlled collapse chip connection (C4) bump or the like. In some embodiments, the second conductive bump 107 is a conductive pillar or post. In some embodiments, the second conductive bump 107 includes metals such as lead, tin, copper, gold, nickel, etc.

In some embodiments, the second die 105 is disposed over the interconnect structure 102. In some embodiments, the second die 105 is disposed adjacent to the first die 104. In some embodiments, the second die 105 is disposed over the second conductive member 102b-2 or the fourth conductive member 102b-4. In some embodiments, the second die 105 is fabricated with a predetermined functional circuit within the second die 105. In some embodiments, the second die 105 is singulated from a semiconductive wafer by a mechanical or laser blade. In some embodiments, the second die 105 comprises a variety of electrical circuits suitable for a particular application. In some embodiments, the electrical circuits include various devices such as transistors, capacitors, resistors, diodes and/or the like. In some embodiments, the second die 105 is a high bandwidth memory (HBM) die. In some embodiments, the second die 105 is a die, a chip or a package. In some embodiments, the second die 105 has a top cross section (a cross section from the top view of the semiconductor structure 100 as shown in FIG. 1) in a quadrilateral, a rectangular or a square shape.

In some embodiments, the second die 105 is a receiving die or a receiver die. In some embodiments, the second die 105 includes a receiving circuit or a receiver. In some embodiments, the receiving circuit of the second die 105 is configured to receive the electrical signal. In some embodiments, the second die 105 is electrically connected to the second conductive member 102b-2 or the fourth conductive member 102b-4. In some embodiments, the electrical signal generated from the first die 104 is converted to an electromagnetic signal, and the electromagnetic signal is transmitted from the first die 104 within the waveguide 103 to the second conductive member 102b-2 or the fourth conductive member 102b-4, and the electromagnetic signal is converted to an electrical signal received by the second die 105, such that the electrical signal from the first die 104 is transmitted to the second die 105 through the waveguide 103.

In some embodiments, the second die 105 is electrically connected to the second conductive member 102b-2 or the fourth conductive member 102b-4 through the redistribution layer (RDL) 106 and the second conductive bump 107. In some embodiments, the second die 105 is electrically connected to the second pad 106b of the RDL 106 through the second conductive bump 107. In some embodiments, the second conductive bump 107 is disposed between the interconnect structure 102 and the second die 105. In some embodiments, the second conductive bump 107 is disposed between the RDL 106 and the second die 105. In some embodiments, the second die 105 is disposed over the second conductive member 102b-2.

In some embodiments, an underfill material 108 is disposed or dispensed over the RDL 106, the interconnect structure 102 and the substrate 101. In some embodiments, the underfill material 108 surrounds the second conductive bump 107. In some embodiments, the underfill material 108 fills spacing between two adjacent second conductive bumps 107. In some embodiments, a sidewall of the first die 104 or a sidewall of the second die 105 is in contact with the underfill material 108. In some embodiments, the underfill material 108 is an electrically insulated adhesive for protecting the second conductive bump 107 or securing a bonding between the first die 104 and the RDL 106 or the second die 105 and the RDL 106. In some embodiments, the underfill material 108 includes epoxy, resin, epoxy molding compounds or etc.

In some embodiments, a molding 109 is disposed over the RDL 106, the interconnect structure 102 and the substrate 101. In some embodiments, the molding 109 surrounds the first die 104 and the second die 105. In some embodiments, the molding 109 covers the underfill material 108. In some embodiments, a portion of the molding 109 is disposed between the first die 104 and the second die 105. In some embodiments, the portion of the molding 109 is disposed over the waveguide 103. In some embodiments, a surface of the first die 104 or a surface of the second die 105 is exposed from the molding 109. In some embodiments, the molding 109 is in contact with the sidewall of the first die 104 or the sidewall of the second die 105. In some embodiments, the molding 109 can be a single layer film or a composite stack. In some embodiments, the molding 109 includes various materials, such as molding compound, molding underfill, epoxy, resin, or the like. In some embodiments, the molding 109 has a high thermal conductivity, a low moisture absorption rate and a high flexural strength.

Figure 2:
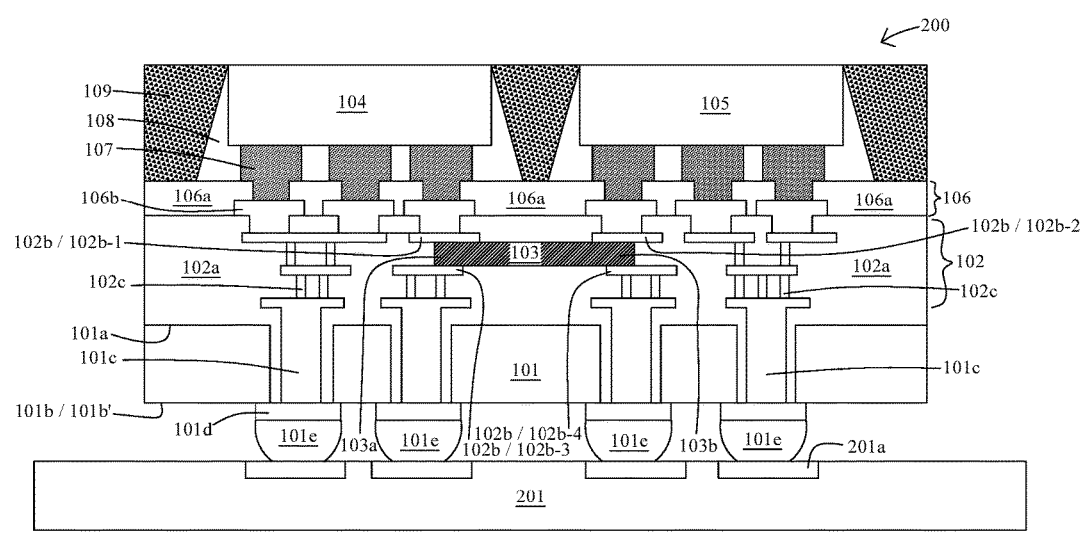
FIG. 2 is a schematic cross sectional view of a semiconductor structure in accordance with some embodiments of the present disclosure.

FIG. 2 is a schematic cross sectional view of semiconductor structure 200 in accordance with various embodiments of the present disclosure. In some embodiments, the semiconductor structure 200 includes a substrate 101, an interconnect structure 102, a waveguide 103, a first die 104 and a second die 105, which have similar configurations as those described above or illustrated in FIG. 1. In some embodiments, the via 101c is surrounded by the dielectric layer 102a. In some embodiments, the dielectric layer 102a is disposed or deposited between the via 101c and the substrate 101.

In some embodiments, the semiconductor structure 200 includes a second substrate 201 and a bond pad 201a disposed or formed over the second substrate 201. In some embodiments, the substrate 101 is disposed over the second substrate 201. In some embodiments, the first conductive bump 101e is disposed or fabricated over the bond pad 201a. In some embodiments, the bond pad 201a is electrically coupled with the first conductive bump 101e. In some embodiments, the first die 104 and the second die 105 are electrically connected to the second substrate 201 through the first conductive bump 101e.

In some embodiments, the second substrate 201 is fabricated with a predetermined functional circuit thereon. In some embodiments, the second substrate 201 includes several conductive traces and several electrical components such as transistor, diode, etc. disposed within the second substrate 201. In some embodiments, the second substrate 201 includes semiconductive materials such as silicon. In some embodiments, the second substrate 201 is a silicon substrate. In some embodiments, the second substrate 201 is a printed circuit board (PCB). In some embodiments, the bond pad 201a includes conductive material such as gold, silver, copper, nickel, tungsten, aluminum, palladium and/or alloys thereof.

Figure 3:
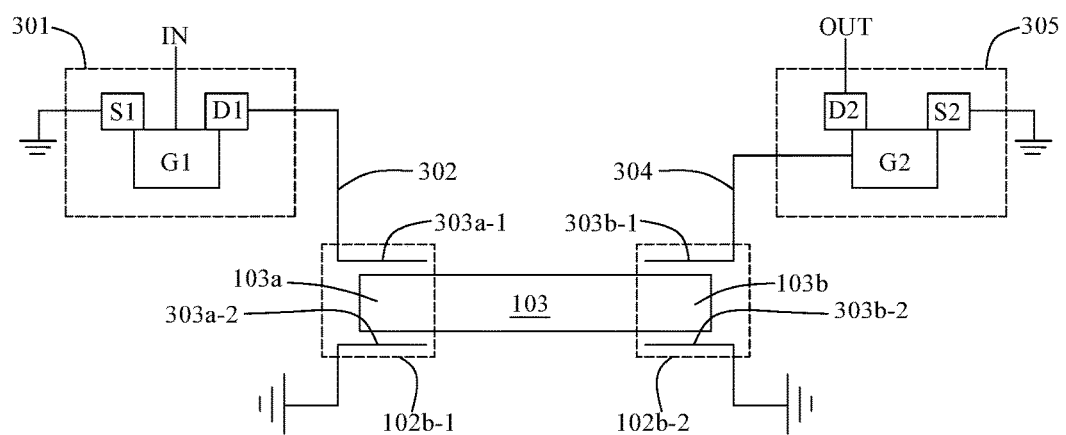
FIG. 3 is a schematic diagram illustrating a transmission circuit, receiving circuit and a waveguide.

FIG. 3 is a schematic diagram of the semiconductor structure 100 in accordance with some embodiments of the present disclosure. In some embodiments, the semiconductor structure 100 includes a transmission circuit 301 and a receiving circuit 305. In some embodiments, the transmission circuit 301 is disposed in the first die 104, and the receiving circuit 305 is disposed in the second die 105.

In some embodiments, the transmission circuit 301 is a driver circuit. In some embodiments, the transmission circuit 301 includes a first source S1, a first drain a1 and a first gate G1. In some embodiments, the first source S1 is electrically grounded. In some embodiments, the transmission circuit 301 is configured to receive an input signal IN to the first gate G1, output an electrical signal from the first drain D1 to a transmission coupling element 303a through a transmission line 302. In some embodiments, the transmission coupling element 303a is disposed over or in the first conductive member 102b-1 or the third conductive member 102b-3. In some embodiments, the transmission coupling element 303a includes a first transmission coupling element 303a-1 and a second transmission coupling element 303a-2. In some embodiments, the transmission coupling element 303a includes conductive material such as gold, silver, copper, nickel, tungsten, aluminum, palladium and/or alloys thereof. In some embodiments, the first transmission coupling element 303a-1 and the second transmission coupling element 303a-2 are disposed opposite to each other. In some embodiments, the second transmission coupling element 303a-2 is electrically grounded. In some embodiments, the first end 103a of the waveguide 103 is surrounded by the transmission coupling element 303a. In some embodiments, the electrical signal from the transmission line 302 to the first transmission coupling element 303a-1 generates an electromagnetic signal corresponding to the electrical signal, and the electromagnetic signal is transmitted from the first end 103a to the second end 103b of the waveguide 103.

In some embodiments, the receiving circuit 305 is a receiver circuit. In some embodiments, the receiving circuit 305 includes a second source S2, a second drain D2 and a second gate G2. In some embodiments, the second source S2 is electrically grounded. In some embodiments, the receiving circuit 305 is configured to receive the electrical signal from a receiving coupling element 303b to the second gate G2 and output an output signal OUT from the second drain D2. In some embodiments, the receiving coupling element 303a is disposed over or in the second conductive member 102b-2 or the fourth conductive member 102b-4. In some embodiments, the receiving coupling element 303b includes a first receiving coupling element 303b-1 and a second receiving coupling element 303b-2. In some embodiments, the receiving coupling element 303b includes conductive material such as gold, silver, copper, nickel, tungsten, aluminum, palladium and/or alloys thereof. In some embodiments, the first receiving coupling element 303b-1 and the second receiving coupling element 303b-2 are disposed opposite to each other. In some embodiments, the second receiving coupling element 303b-2 is electrically grounded. In some embodiments, the second end 103b of the waveguide 103 is surrounded by the receiving coupling element 303b. In some embodiments, the electromagnetic signal from the waveguide 103 is converted to an electrical signal at the receiving coupling element 303b, and the electrical signal is transmitted through the receiving line 304 to the second gate G2.

Figure 4:
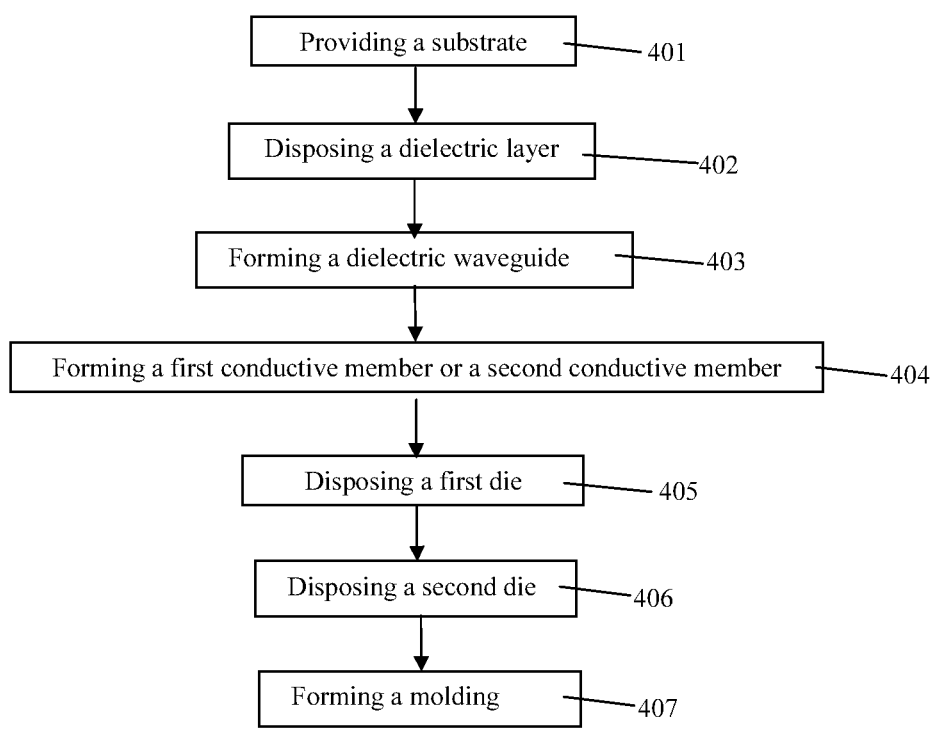
FIG. 4 is a flow diagram of a method of manufacturing a semiconductor structure in accordance with some embodiments of the present disclosure.

In the present disclosure, a method of manufacturing a semiconductor structure (100 or 200) is also disclosed. In some embodiments, the semiconductor structure (100 or 200) is formed by a method 400. The method 400 includes a number of operations and the description and illustration are not deemed as a limitation as the sequence of the operations. FIG. 4 is an embodiment of the method 400 of manufacturing the semiconductor structure (100 or 200). The method 400 includes a number of operations (401, 402, 403, 404, 405, 406 and 407).

Figure 4A:
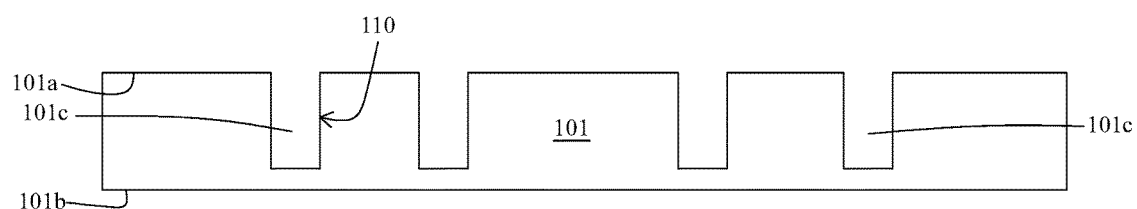
FIGS. 4A-4O are schematic views of manufacturing a semiconductor structure by a method of FIG. 4 in accordance with some embodiments of the present disclosure.
Figure 4B:
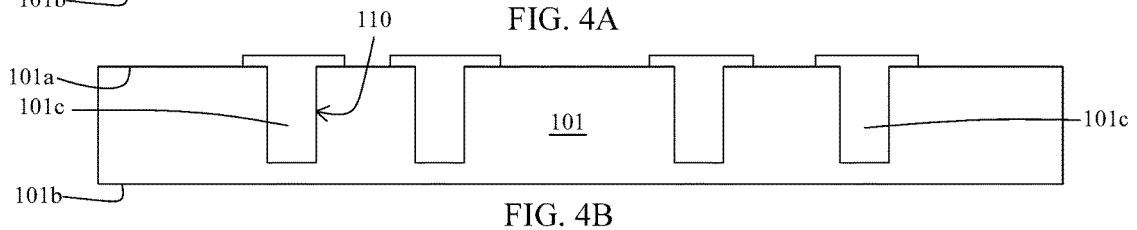

In operation 401, a substrate 101 is provided or received as shown in FIGS. 4A and 4B. In some embodiments, the substrate 101 is a semiconductive substrate. In some embodiments, the substrate 101 is a silicon substrate or silicon interposer. In some embodiments, the substrate 101 includes a first surface 101a and a second surface 101b opposite to the first surface 101a. In some embodiments, the substrate 101 has configuration similar to the one described above or illustrated in FIG. 1 or 2.

In some embodiments, a via 101c extended through at least a portion of the substrate 101 is formed. In some embodiments, the via 101c is extended between the first surface 101a and the second surface 101b. In some embodiments, the via 101c is a through silicon via (TSV). In some embodiments, the via 101c is formed by removing a portion of the substrate 101 to form a first recess 110 as shown in FIG. 4A and forming a conductive material into the first recess 110 to form the via 101c as shown in FIG. 4B. In some embodiments, the removal of the portion of the substrate 101 includes photolithography, etching or any other suitable operations. In some embodiments, the formation of the conductive material includes sputtering, electroplating or any other suitable operations. In some embodiments, the via 101c has configuration similar to the one described above or illustrated in FIG. 1 or 2. In some embodiments, a dielectric material is deposited over the substrate 101 and along a sidewall of the first recess 110 before the formation of the conductive material into the first recess 110. In some embodiments, the dielectric material surrounds the via 101c. In some embodiments, the dielectric material is deposited between the via 101c and the substrate 101.

Figure 4C:
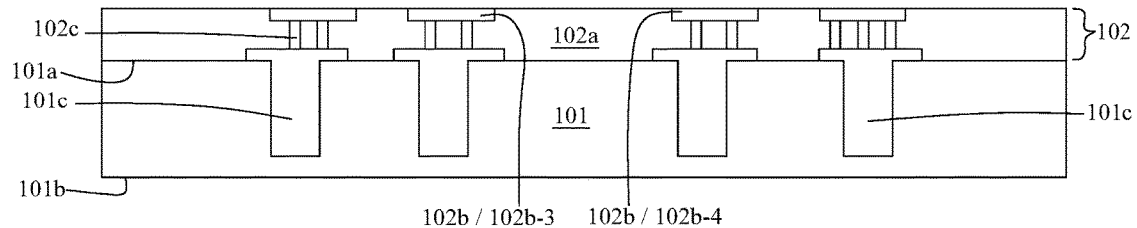

In operation 402, a first layer of a dielectric layer 102a is deposited over the substrate 101 as shown in FIG. 4C. In some embodiments, the first layer of the dielectric layer 102a is a low dielectric constant electrical isolation layer. In some embodiments, the first layer of the dielectric layer 102a includes silicon dioxide, fluorine-doped silicon dioxide, carbon-doped silicon dioxide, porous silicon dioxide, a dielectric material having a low dielectric constant (Low K), a dielectric material having an ultra-low dielectric constant (ULK), a dielectric material having a dielectric constant substantially less than a dielectric constant of silicon dioxide, a dielectric material having a dielectric constant substantially less than 4. In some embodiments, the dielectric layer 102a is deposited by spin coating, chemical vapor deposition (CVD), plasma-enhanced CVD (PECVD), high-density plasma CVD (HDPCVD) or any other suitable operations.

In some embodiments, some conductive members 102b and some conductive vias 102c are formed after the deposition of the first layer of the dielectric layer 102a. In some embodiment, some conductive members 102b and some conductive vias 102c are formed within the first layer of the dielectric layer 102a. In some embodiments, some conductive members 102b including a third conductive member 102b-3 and a fourth conductive member 102b-4 are formed. In some embodiments, some conductive members 102b are formed by removing a portion of the first layer of the dielectric layer 102a and disposing a conductive material. In some embodiments, the removal of the portion of the dielectric layer 102a includes photolithography, etching or any other suitable operations. In some embodiments, the formation of the conductive material includes sputtering, electroplating or any other suitable operations. In some embodiments, the conductive member 102b has configuration similar to the one described above or illustrated in FIG. 1 or 2.

In some embodiments, some conductive vias 102c are formed within the first layer of the dielectric layer 102a. In some embodiments, the conductive via 102c is formed removing a portion of the dielectric layer 102a and forming a conductive material. In some embodiments, the removal of the first layer of the portion of the dielectric layer 102a includes photolithography, etching or any other suitable operations. In some embodiments, the forming of the conductive material includes sputtering, electroplating or any other suitable operations. In some embodiments, the conductive via 102c has configuration similar to the one described above or illustrated in FIG. 1 or 2. In some embodiments, some conductive members 102b and some conductive vias 102c are formed separately or simultaneously.

In operation 403, a waveguide 103 is formed within the dielectric layer 102a as shown in FIGS. 4D-4H. In some embodiments, the waveguide 103 is formed over some conductive members 102b or some conductive vias 102c. In some embodiments, the waveguide 103 is deposited over the third conductive member 102b-3 and the fourth conductive member 102b-4. In some embodiments, the waveguide 103 is formed between the third conductive member 102b-3 and the fourth conductive member 102b-4. In some embodiments, the waveguide 103 is coupled with the third conductive member 102b-3 and the fourth conductive member 102b-4.

Figure 4D:
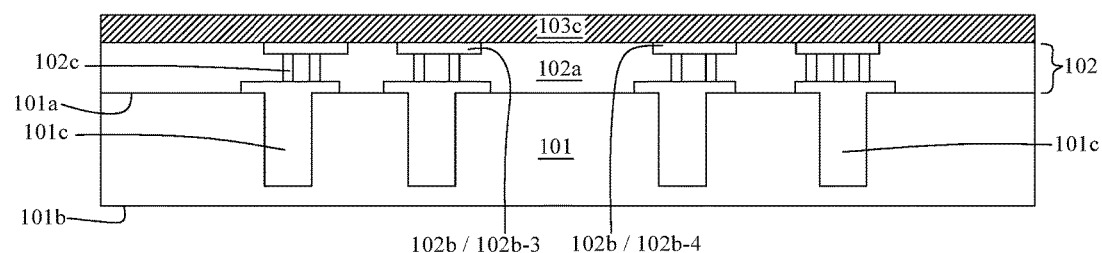
Figure 4E:
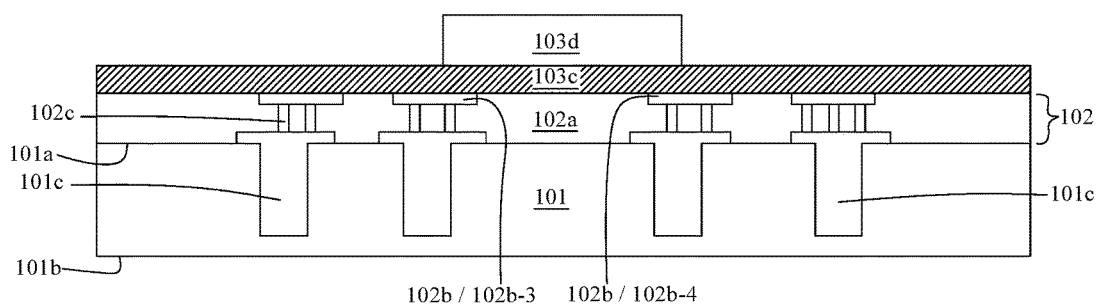
Figure 4F:
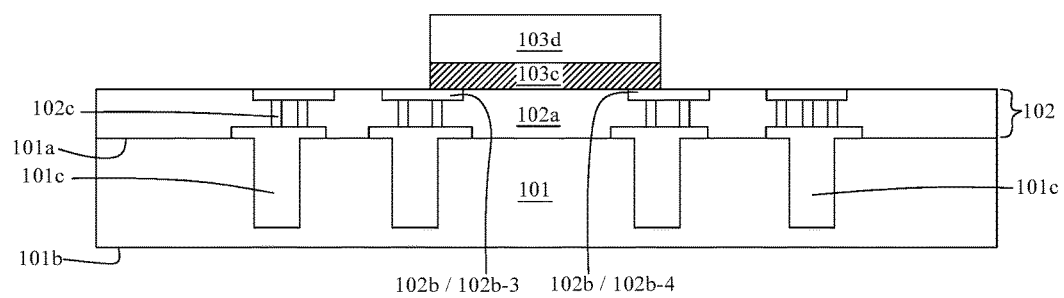
Figure 4G:
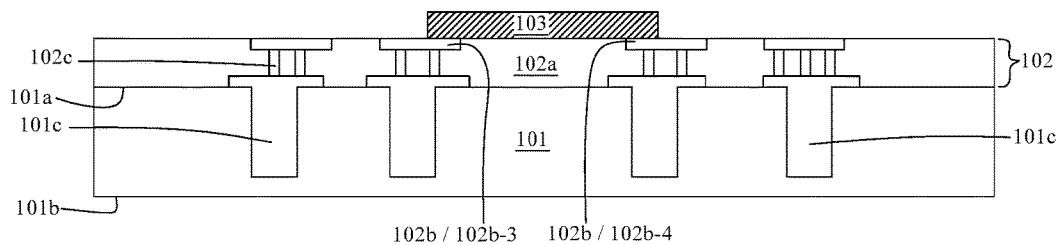
Figure 4H:
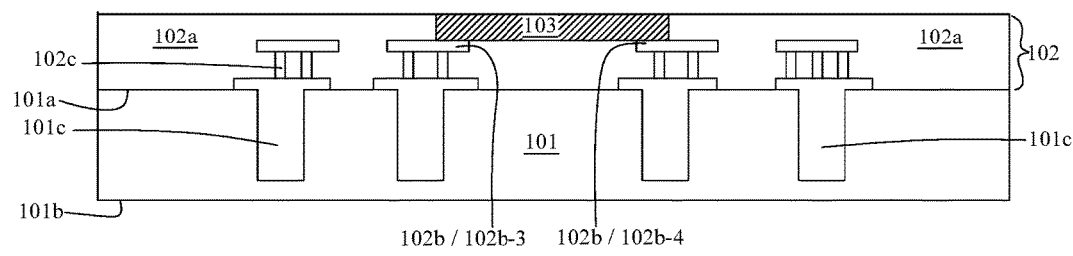

In some embodiments, the waveguide 103 is formed by depositing a waveguide material 103c over the first layer of the dielectric layer 102a as shown in FIG. 4D, coating and pattern defining photoresist 103d over the waveguide material 103c as shown in FIG. 4E, and removing a portion of the waveguide material 103c exposed from the photoresist 103d to form the waveguide 103 as shown in FIG. 4F. In some embodiments, the photoresist 103d is removed after the formation of the waveguide 103 as shown in FIG. 4G. In some embodiments, the portion of the waveguide material 103c exposed from the photoresist 103d is removed by wet etching, plasma etching or any other suitable operations. In some embodiments, the waveguide material 103c has a dielectric constant substantially greater than a dielectric constant of the dielectric layer 102a. In some embodiments, the disposing of the waveguide material 103c includes spin coating, chemical vapor deposition (CVD), plasma-enhanced CVD (PECVD), high-density plasma CVD (HDP-CVD), sub-atmospheric CVD (SACVD), atmospheric pressure CVD (APCVD), metal organic CVD (MOCVD), laser CVD (LCVD), electron beam (e.g. electronic gun) evaporation or any other suitable operations. In some embodiments, the photoresist 103d is removed by etching, stripping or any other suitable operations. In some embodiments, a second layer of the dielectric layer 102a is deposited over the substrate 101 to surround the waveguide 103 as shown in FIG. 4H. In some embodiments, the second layer of the dielectric layer 102a is deposited to cover the waveguide 103, and then thinning down to expose the waveguide 103 by planarization, chemical mechanical polish (CMP) or any other suitable operations. In some embodiments, the second layer of the dielectric layer 102a is similar to the first layer of the dielectric layer 102a. In some embodiments, the waveguide 103 has configuration similar to the one described above or illustrated in FIG. 1, 2 or 3.

Figure 4I:
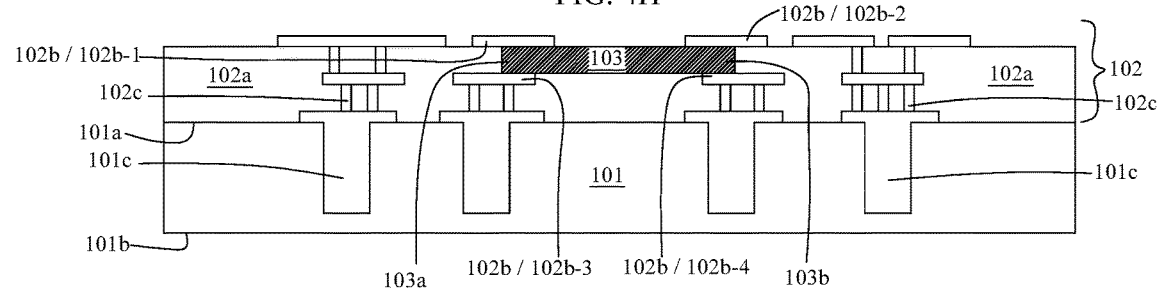

In operation 404, a first conductive member 102b-1 or a second conductive member 102b-2 is formed within the dielectric layer 102a as shown in FIG. 4I. In some embodiments, some conductive members 102b including a first conductive member 102b-1 and a second conductive member 102b-2 are formed. In some embodiments, the waveguide 103 is formed after the formation of the third conductive member 102b-3 and the fourth conductive member 102b-4 but before the formation of a first conductive member 102b-1 and a second conductive member 102b-2. In some embodiments, the waveguide 103 is formed between the first conductive member 102b-1 and the second conductive member 102b-2. In some embodiments, the waveguide 103 is coupled with the first conductive member 102b-1 and the second conductive member 102b-2.

In some embodiments, the first conductive member 102b-1 or the second conductive member 102b-2 is formed by removing a portion of the second layer of the dielectric layer 102a and forming a conductive material. In some embodiments, the removal of the portion of the second layer of the dielectric layer 102a includes photolithography, etching or any other suitable operations. In some embodiments, the disposing of the conductive material includes sputtering, electroplating or any other suitable operations. In some embodiments, the first conductive member 102b-1 and the second conductive member 102b-2 have configuration similar to the one described above or illustrated in FIG. 1 or 2. In some embodiments, an interconnect structure 102 including the dielectric layer 102a, the conductive member 102b and the conductive via 102c is formed over the substrate 101. In some embodiments, the waveguide 103 is disposed within the interconnect structure 102. In some embodiments, some conductive members 102b or some conductive vias 102c are formed after the formation of the waveguide 103.

Figure 4J:
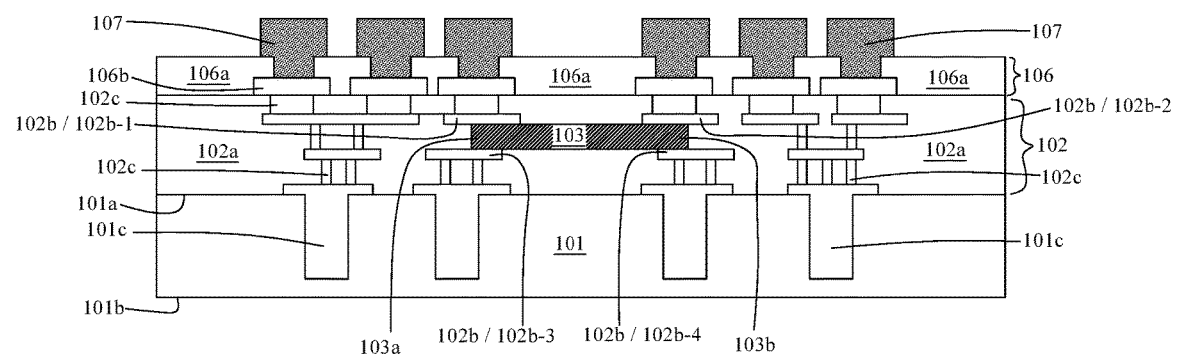

In some embodiments, a RDL 106 is formed over the interconnect structure 102 as shown in FIG. 4J after the formation of the waveguide 103. In some embodiments, the RDL 106 including a second dielectric layer 106a and a second pad 106b is formed. In some embodiments, the second pad 106b is formed over and electrically connected to the conductive member 102b. In some embodiments, the second pad 106b is formed by disposing a conductive material over the dielectric layer 102a and the conductive member 102b. In some embodiments, the second pad 106b is formed by sputtering, electroplating or any other suitable operations.

In some embodiments, the second dielectric layer 106a is disposed over the dielectric layer 102a. In some embodiments, the second dielectric layer 106a is deposited by spin coating, chemical vapor deposition (CVD), plasma-enhanced CVD (PECVD), high-density plasma CVD (HDP-CVD) or any other suitable operations. In some embodiments, some portions of the second dielectric layer 106a are removed to at least partially expose the second pad 106b. In some embodiments, some portions of the second dielectric layer 106a are removed by photolithography, etching or any other suitable operations. In some embodiments, the second dielectric layer 106a and the second pad 106b have configuration similar to the one described above or illustrated in FIG. 1 or 2.

In some embodiments, a second conductive bump 107 is fabricated over the second pad 106b as shown in FIG. 4J. In some embodiments, the second conductive bump 107 is bonded with the second pad 106. In some embodiments, the second conductive bump 107 is fabricated by ball dropping, solder pasting, stencil printing or any other suitable operations. In some embodiments, the second conductive bump 107 is reflowed after the formation.

Figure 4K:
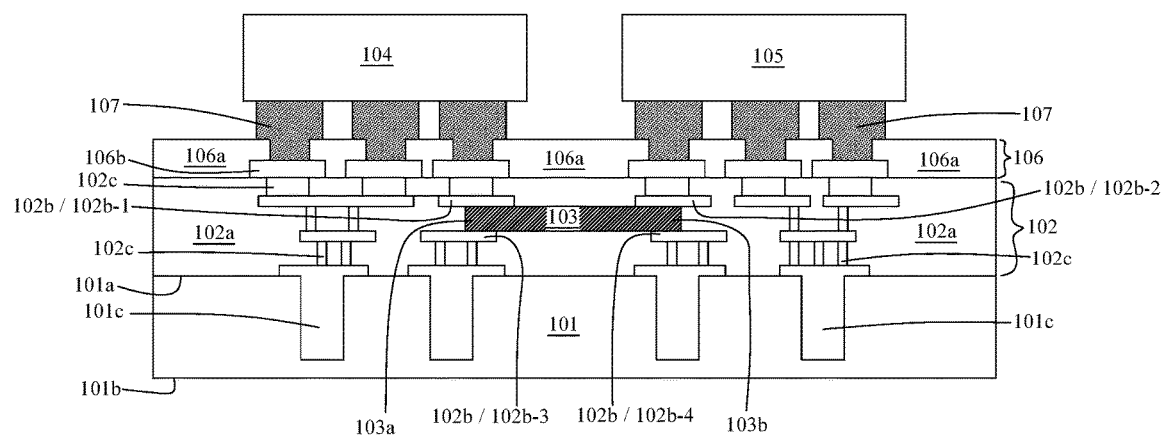

In operation 405, a first die 104 is disposed over the dielectric layer 102a as shown in FIG. 4K. In some embodiments, the first die 104 is bonded over the substrate 101. In some embodiments, the first die 104 is a logic device die, central processing unit (CPU) die, graphics processing unit (GPU) die, mobile phone application processing (AP) die or the like. In some embodiments, the first die 104 is a system on chip (SoC) that integrates all electronic components into a single die. In some embodiments, the first die 104 is a transmission die or a driver die. In some embodiments, the first die 104 includes a transmission circuit or a transmitter. In some embodiments, the transmission circuit of the first die 104 is configured to generate an electrical signal. In some embodiments, the first die 104 is electrically connected to the first conductive member 102b-1 or the third conductive member 102b-3. In some embodiments, the electrical signal is transmitted from the first die 104 to the first conductive member 102b-1 or the third conductive member 102b-3. In some embodiments, the first die 104 has configuration similar to the one described above or illustrated in FIG. 1 or 2.

In some embodiments, the first die 104 is electrically connected to the conductive member 102b or the conductive via 102c through the second conductive bump 107. In some embodiments, the second conductive bump 107 is disposed between the first die 104 and the dielectric layer 102a to electrically connect the first die 104 to the first conductive member 102b-1 or the third conductive member 102b-3. In some embodiments, the second conductive bump 107 is bonded with the second pad 106b, such that the first die 104 is electrically connected to the via 101c, the conductive member 102b or the conductive via 102c. In some embodiments, the electrical signal from the first die 104 is transmitted to the first conductive member 102b-1 or the third conductive member 102b-3 through the second conductive bump 107.

In operation 406, a second die 105 is disposed over the dielectric layer 102a as shown in FIG. 4K. In some embodiments, the second die 105 is disposed adjacent to the first die 104. In some embodiments, the second die 105 is bonded over the substrate 101. In some embodiments, the second die 105 is a high bandwidth memory (HBM) die. In some embodiments, the second die 105 is a receiving die or a receiver die. In some embodiments, the second die 105 includes a receiving circuit or a receiver. In some embodiments, the receiving circuit of the second die 105 is configured to receive the electrical signal. In some embodiments, the second die 105 is electrically connected to the second conductive member 102*b*-2 or the fourth conductive member 102*b*-4. In some embodiments, the electrical signal generated from the first die 104 is converted to an electromagnetic signal, and the electromagnetic signal is transmitted from the first die 104 within the waveguide 103 to the second conductive member 102*b*-2 or the fourth conductive member 102*b*-4, and the electromagnetic signal is converted to an electrical signal received by the second die 105, such that the electrical signal from the first die 104 is transmitted to the second die 105 through the waveguide 103. In some embodiments, the second die 105 has configuration similar to the one described above or illustrated in FIG. 1 or 2.

In some embodiments, the second die 105 is electrically connected to the conductive member 102*b* or the conductive via 102*c* through the second conductive bump 107. In some embodiments, the second conductive bump 107 is disposed between the second die 105 and the dielectric layer 102*a* to electrically connect the second die 105 to the second conductive member 102*b*-2 or the fourth conductive member 102*b*-4. In some embodiments, the second conductive bump 107 is bonded with the second pad 106*b*, such that the second die 105 is electrically connected to the via 101*c*, the conductive member 102*b* or the conductive via 102*c*. In some embodiments, the electrical signal transmitted through the waveguide 103, the third conductive member 102*b*-3 or the fourth conductive member 102*b*-4 is received by the second die 105 through the second conductive bump 107.

Figure 4L:
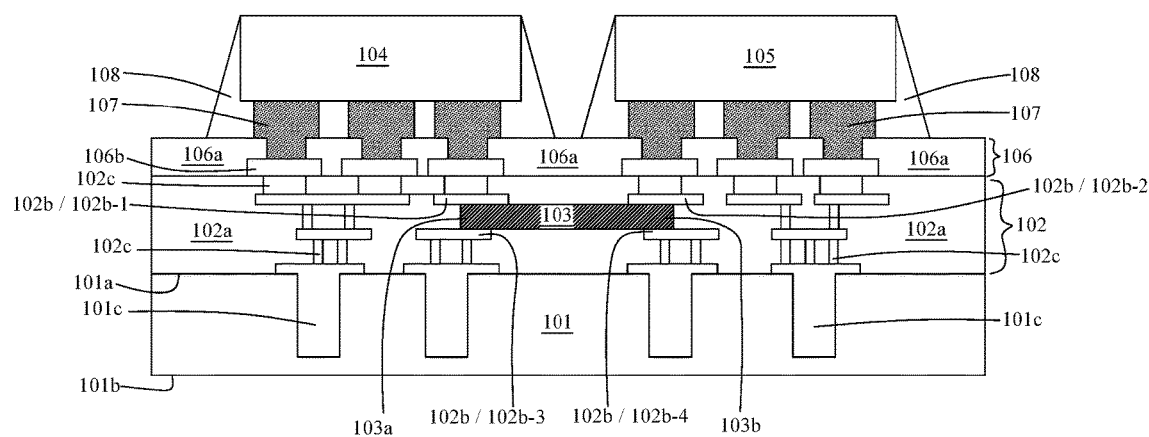

In some embodiments, an underfill material 108 is disposed to surround the second conductive bump 107 as shown in FIG. 4L after the disposing of the first die 104 and the second die 105. In some embodiments, the underfill material 108 surrounds the first die 104 and the second die 105 and fills gap between the adjacent second conductive bumps 107. In some embodiments, the underfill material 108 is disposed by flowing, injection or any other suitable operations. In some embodiments, the underfill material 108 has configuration similar to the one described above or illustrated in FIG. 1 or 2.

Figure 4M:
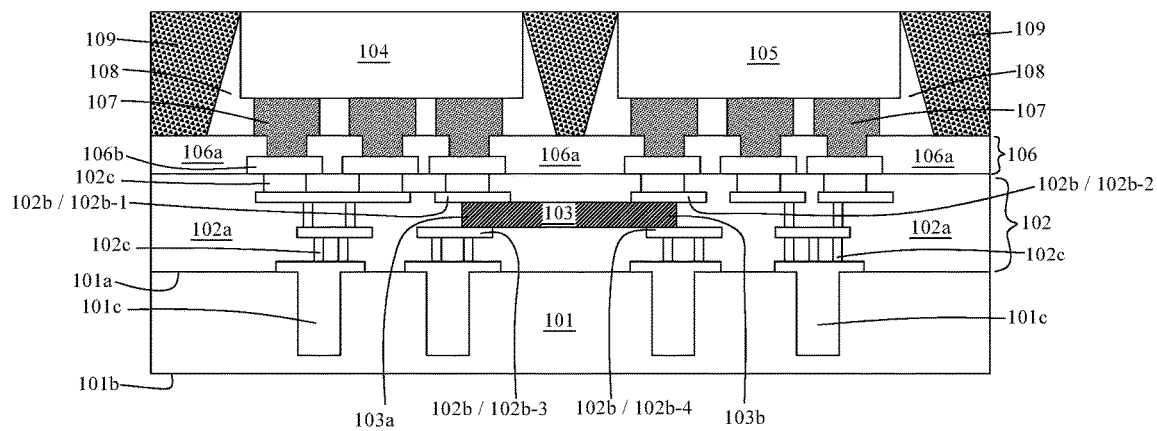

In operation 407, a molding 109 is formed as shown in FIG. 4M. In some embodiments, the molding 109 is formed over the RDL 106, the interconnect structure 102 and the substrate 101. In some embodiments, the molding 109 surrounds the first die 104, the second die 105, the underfill material 108 and the second conductive bump 107. In some embodiments, the molding 109 is formed by transfer molding, injection molding, over molding or any other suitable operations. In some embodiments, the molding 109 is ground to expose a surface of the first die 104 or the second die 105. In some embodiments, the molding 109 is ground by grinding, planarization, chemical mechanical polish (CMP) or any other suitable operations. In some embodiments, the molding 109 has configuration similar to the one described above or illustrated in FIG. 1 or 2.

Figure 4N:
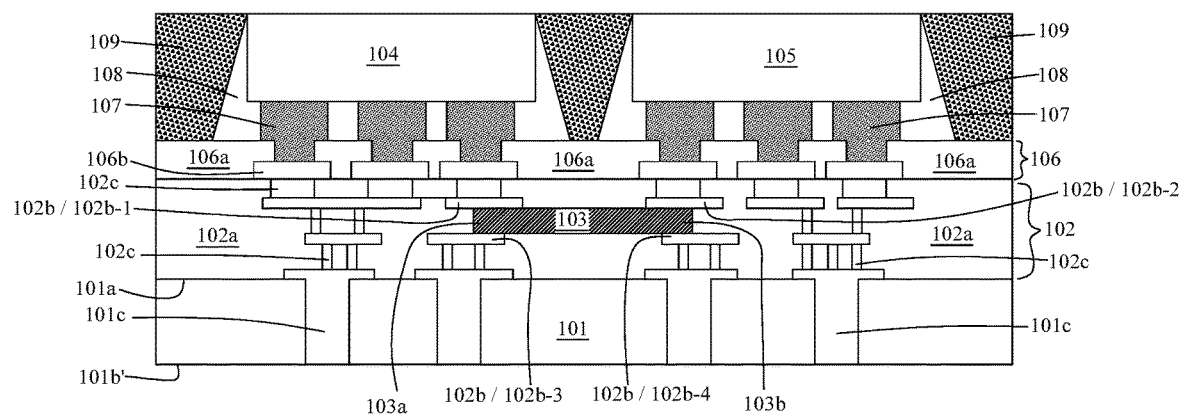

In some embodiments, the substrate 101 is ground from the second surface 101*b* to expose the via 101*c* as shown in FIG. 4N. In some embodiments, the second surface 101*b* is ground to become a new second surface 101*b*'. In some embodiments, a carrier is temporarily attached to the first die 104, the second die 105 and the molding 109 by an adhesive, and then the substrate 101 is ground from the second surface 101*b*. In some embodiments, the carrier includes silicon or glass. In some embodiments, the adhesive is a light to heat conversion (LTHC) release film or the like. In some embodiments, the substrate 101 is ground by backside grinding, CMP or any other suitable operations.

Figure 4O:
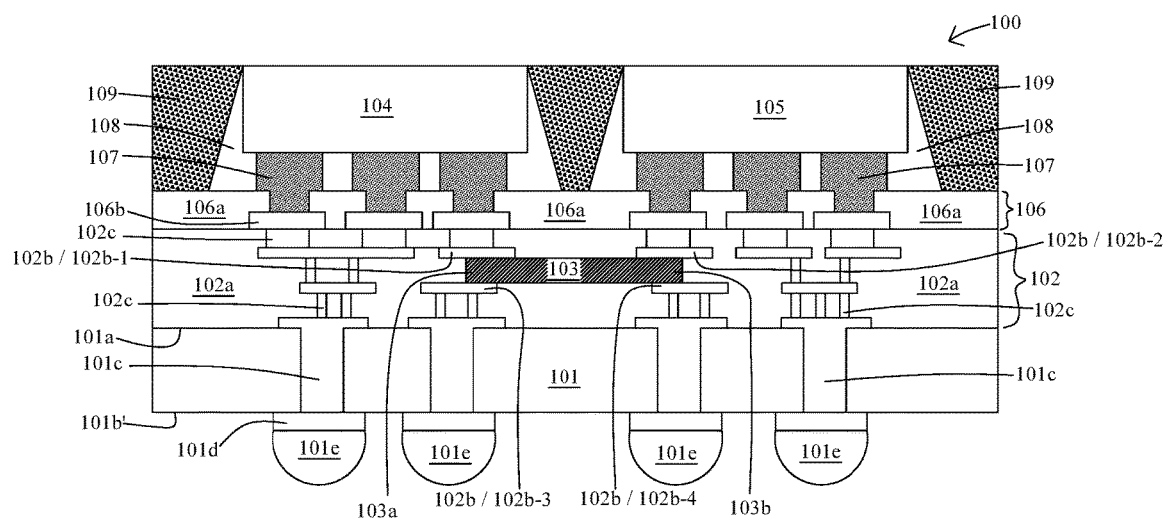

In some embodiments, a first pad 101*d* is formed over the substrate 101 as shown in FIG. 4O. In some embodiments, the first pad 101*d* is formed over the second surface 101*b*' of the substrate 101. In some embodiments, the first pad 101*d* is formed over and electrically connected to the via 101*c*. In some embodiments, the first pad 101*d* is formed by disposing a conductive material over the substrate 101. In some embodiments, the forming of the conductive material includes sputtering, electroplating or any other suitable operations. In some embodiments, the first pad 101*d* has configuration similar to the one described above or illustrated in FIG. 1 or 2.

In some embodiments, a first conductive bump 101*e* is fabricated over the substrate 101. In some embodiments, the first conductive bump 101*e* is electrically connected to the conductive member 102*b* through the via 101*c*. In some embodiments, the first conductive bump 101*e* is electrically connected to the first conductive member 102*b*-1, the second conductive member 102*b*-2, the third conductive member 102*b*-3 or the fourth conductive member 102*b*-4 through the via 101*c*. In some embodiments, the first conductive bump 101*e* is disposed over the first pad 101*d*. In some embodiments, the first conductive bump 101*e* is disposed before or after the formation of the waveguide 103. In some embodiments, the first conductive bump 101*e* is disposed before the disposing of the first die 104 and the second die 105. In some embodiments, the first conductive bump 101*e* is fabricated by ball dropping, solder pasting, stencil printing or any other suitable operations. In some embodiments, the first conductive bump 101*e* is reflowed after the fabrication. In some embodiments, the first conductive bump 101*e* has configuration similar to the one described above or illustrated in FIG. 1 or 2. In some embodiments, a semiconductor structure 100 is formed, which has configuration similar to the one described above or illustrated in FIG. 1.

In the present disclosure, a semiconductor structure is disclosed. The semiconductor structure includes a waveguide disposed or formed between two conductive members in an interconnect structure. An electrical signal from a transmission die is converted to an electromagnetic signal at one conductive member, the electromagnetic signal is then transmitted through the waveguide to another conductive member, the electromagnetic signal is converted to an electrical signal at another conductive member, and the electrical signal is transmitted to a receiving die. Such signal transmission can minimize or prevent energy loss, and transmission speed is improved or increased.

In some embodiments, a semiconductor structure includes a substrate; an interconnect structure disposed or deposited over the substrate and including a dielectric layer over the substrate, a first conductive member disposed or formed within the dielectric layer and a second conductive member disposed or formed within the dielectric layer; a waveguide disposed between the first conductive member and the second conductive member; a first die disposed over the interconnect structure and electrically connected to the first conductive member; and a second die disposed over the interconnect structure and electrically connected to the second conductive member, wherein the waveguide is coupled with the first conductive member and the second conductive member.

In some embodiments, the first die and the second die are disposed adjacent to each other. In some embodiments, the waveguide is configured to transmit an electromagnetic signal from the first conductive member to the second conductive member within the waveguide. In some embodiments, the waveguide is configured to transmit an electromagnetic signal in a frequency of greater than 10 GHz. In some embodiments, a dielectric constant of the waveguide is substantially greater than a dielectric constant of the dielectric layer. In some embodiments, the first die is disposed over the first conductive member, and the second die is disposed over the second conductive member. In some embodiments, the first conductive member and the second conductive member are laterally extended within the dielectric layer. In some embodiments, the waveguide includes silicon nitride, silicon carbide or a dielectric material with a dielectric constant substantially greater than 4. In some embodiments, the semiconductor structure further includes a molding surrounding the first die and the second die. In some embodiments, a portion of the molding is disposed or formed over the waveguide. In some embodiments, the semiconductor structure further includes a via extended through at least a portion of the substrate and electrically connected to the first conductive member or the second conductive member; a first conductive bump disposed or fabricated over the substrate and the via and electrically connected to the via; a second conductive bump disposed or fabricated between the first die and the interconnect structure or between the second die and the interconnect structure; an underfill material surrounding the second conductive bump.

In some embodiments, a semiconductor structure includes a substrate; a via extended through at least a portion of the substrate; an interconnect structure disposed or deposited over the substrate and including a dielectric layer, a first transmission electrode disposed or formed within the dielectric layer and a first receiving electrode formed or disposed within the dielectric layer; a waveguide formed or disposed within the dielectric layer; a transmission die disposed over the interconnect structure and including a transmission circuit electrically connected to the first transmission electrode; and a receiving die disposed over the interconnect structure and including a receiving circuit electrically connected to the first receiving electrode, wherein the via is electrically connected to the first transmission electrode or the first receiving electrode, the transmission circuit is configured to generate an electrical signal, the receiving circuit is configured to receive the electrical signal, the electrical signal is convertible to an electromagnetic signal transmittable from the first transmission electrode to the first receiving electrode within the waveguide.

In some embodiments, the semiconductor structure further includes a second transmission electrode formed or disposed within the dielectric layer and disposed or disposed opposite to the first transmission electrode; a second receiving electrode formed or disposed within the dielectric layer and disposed or disposed opposite to the first receiving electrode. In some embodiments, a first end of the waveguide is surrounded by the first transmission electrode and the second transmission electrode, and a second end of the waveguide opposite to the first end is surrounded by the first receiving electrode and the second receiving electrode. In some embodiments, a height of the waveguide is about 1 μm to about 10 μm, or a width of the waveguide is about 10 μm to about 100 μm. In some embodiments, the transmission die includes a system on chip (SoC), central processing unit (CPU) die, graphics processing unit (GPU) die or mobile phone application processing (AP) die, and the receiving die includes high bandwidth memory (HBM) die. In some embodiments, a transmission speed of the electromagnetic signal is substantially greater than 10 Gigabytes per second (Gb/s).

In some embodiments, a method of manufacturing a semiconductor structure includes providing a substrate; depositing a dielectric layer over the substrate; forming a waveguide within the dielectric layer; forming a first conductive member and a second conductive member within the dielectric layer; disposing a first die over the dielectric layer; disposing a second die over the dielectric layer and adjacent to the first die; and forming a molding to surround the first die and the second die, wherein the waveguide is formed between the first conductive member and the second conductive member.

In some embodiments, the forming of the waveguide includes depositing a waveguide material over the dielectric layer, coating a photoresist over the dielectric layer, and removing a portion of the waveguide material exposed from the photoresist. In some embodiments, the method further includes forming a via extended through at least a portion of the substrate; fabricating a first conductive bump over the substrate to electrically connect to the first conductive member or the second conductive member by the via; fabricating a second conductive bump between the first die and the dielectric layer or between the second die and the dielectric layer to electrically connect the first die to the first conductive member or the second die to the second conductive member; dispensing an underfill material to surround the second conductive bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a semiconductive substrate;
an interconnect structure disposed over the semiconductive substrate and including a dielectric layer over the semiconductive substrate, a first conductive member disposed within the dielectric layer and a second conductive member disposed within the dielectric layer;
a via extended through at least a portion of the semiconductive substrate and electrically connected to the first conductive member or the second conductive member;
a waveguide disposed between the first conductive member and the second conductive member;
a first die disposed over the interconnect structure and electrically connected to the first conductive member; and
a second die disposed over the interconnect structure and electrically connected to the second conductive member,
wherein the waveguide is coupled with the first conductive member and the second conductive member, the waveguide is electrically connected to the via through the first conductive member or the second conductive member, the waveguide has a surface facing the first die and the second die, and the first conductive member and the second conductive member are in contact with the surface of the waveguide.

2. The semiconductor structure of claim 1, wherein the first die and the second die are disposed adjacent to each other.

3. The semiconductor structure of claim 1, wherein the waveguide is configured to transmit an electromagnetic signal from the first conductive member to the second conductive member within the waveguide.

4. The semiconductor structure of claim 1, wherein the waveguide is configured to transmit an electromagnetic signal in a frequency of greater than 10 GHz.

5. The semiconductor structure of claim 1, wherein a dielectric constant of the waveguide is substantially greater than a dielectric constant of the dielectric layer.

6. The semiconductor structure of claim 1, wherein the first die is disposed over the first conductive member, and the second die is disposed over the second conductive member.

7. The semiconductor structure of claim 1, wherein the first conductive member and the second conductive member are laterally extended within the dielectric layer.

8. The semiconductor structure of claim 1, wherein the waveguide includes silicon nitride, silicon carbide or a dielectric material with a dielectric constant substantially greater than 4.

9. The semiconductor structure of claim 1, further comprising a molding surrounding the first die and the second die.

10. The semiconductor structure of claim 9, wherein a portion of the molding is disposed over the waveguide.

11. The semiconductor structure of claim 1, further comprising:
a first conductive bump disposed over the semiconductive substrate and the via and electrically connected to the via;
a second conductive bump disposed between the first die and the interconnect structure or between the second die and the interconnect structure; and
an underfill material surrounding the second conductive bump.

12. A semiconductor structure, comprising:
a semiconductive substrate;
a via extended through at least a portion of the semiconductive substrate;
an interconnect structure disposed over the semiconductive substrate and including a dielectric layer, a first transmission electrode disposed within the dielectric layer and a first receiving electrode disposed within the dielectric layer;
a waveguide disposed within the dielectric layer and in contact with the first transmission electrode and the first receiving electrode;
a transmission die disposed over the interconnect structure and including a transmission circuit electrically connected to the first transmission electrode; and
a receiving die disposed over the interconnect structure and including a receiving circuit electrically connected to the first receiving electrode,
wherein the via is electrically connected to the first transmission electrode or the first receiving electrode, the waveguide is electrically connected to the via through the first transmission electrode or the first receiving electrode, the transmission circuit is configured to generate an electrical signal, the receiving circuit is configured to receive the electrical signal, the electrical signal is convertible to an electromagnetic signal transmittable from the first transmission electrode to the first receiving electrode within the waveguide.

13. The semiconductor structure of claim 12, further comprising:
a second transmission electrode disposed within the dielectric layer and disposed opposite to the first transmission electrode; and
a second receiving electrode disposed within the dielectric layer and disposed opposite to the first receiving electrode.

14. The semiconductor structure of claim 13, wherein a first end of the waveguide is surrounded by the first transmission electrode and the second transmission electrode, and a second end of the waveguide opposite to the first end is surrounded by the first receiving electrode and the second receiving electrode.

15. The semiconductor structure of claim 12, wherein a height of the waveguide is about 1 um to about 10 um, or a width of the waveguide is about 10 μm to about 100 μm.

16. The semiconductor structure of claim 12, wherein the transmission die includes a system on chip (SoC), central processing unit (CPU) die, graphics processing unit (GPU) die or mobile phone application processing (AP) die, and the receiving die includes high bandwidth memory (HBM) die.

17. The semiconductor structure of claim 12, wherein the waveguide includes silicon nitride, silicon carbide, low-temperature silicon dioxide (SiO2), silicon nitride (SiNx), silicon oxynitride (SiOxNy), low-temperature titanium dioxide (TiO2), zirconium dioxide (ZrO2), aluminum oxide (Al2O3), hafnium oxide (HfOx), Hafnium silicate (HfSiOx), zirconium titanate (ZrTiOx), tantalum oxide (TaOx), strontium titanate (SrTiO3 or barium titanate (BaTiO3).

18. A semiconductor structure, comprising:
a semiconductive substrate;
a dielectric layer over the semiconductive substrate;
a first conductive member and a second conductive member disposed within the dielectric layer;
a third conductive member and a fourth conductive member disposed within the dielectric layer and below the first conductive member and the second conductive member;
a waveguide disposed within the dielectric layer, an end of the waveguide disposed between and in contact with the first conductive member and the third conductive member, and another end of the waveguide disposed between and in contact with the second conductive member and the fourth conductive member; and
a via extended through at least a portion of the semiconductive substrate and electrically connected to the first conductive member or the second conductive member;
wherein the waveguide is coupled with the first conductive member and the second conductive member to transmit an electromagnetic signal from the first conductive member to the second conductive member, and the via is electrically connected to the waveguide through the first conductive member or the second conductive member.

19. The semiconductor structure of claim 18, wherein the first conductive member is configured to convert an electrical signal to the electromagnetic signal, and the second conductive member is configured to receive the electromagnetic signal and convert the electromagnetic signal to an electrical signal.

20. The semiconductor structure of claim 18, further comprising a first die electrically connected to the first conductive member and a second die electrically connected to the second conductive member.

* * * * *